United States Patent
Jo et al.

(10) Patent No.: US 8,569,761 B2
(45) Date of Patent: Oct. 29, 2013

(54) ORGANIC LIGHT EMITTING DISPLAY DEVICE

(75) Inventors: Soo-Beom Jo, Yongin (KR); Sung-Won Doh, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 41 days.

(21) Appl. No.: 13/162,455

(22) Filed: Jun. 16, 2011

(65) Prior Publication Data

US 2012/0012849 A1 Jan. 19, 2012

(30) Foreign Application Priority Data

Jul. 14, 2010 (KR) .................. 10-2010-0068007

(51) Int. Cl.
*H01L 29/04* (2006.01)

(52) U.S. Cl.
USPC .......... 257/59; 257/40; 257/E51.018; 438/34; 438/99

(58) Field of Classification Search
USPC ............. 257/59, 72, E33.062, E51.018, 40; 438/34, 99
See application file for complete search history.

(56) References Cited

U.S. PATENT DOCUMENTS

| 2005/0046342 A1* | 3/2005 | Park et al. ............... 313/504 |
| 2006/0022587 A1* | 2/2006 | Jeong et al. ............. 313/504 |
| 2007/0052352 A1* | 3/2007 | Im et al. ................. 313/506 |

FOREIGN PATENT DOCUMENTS

| JP | 1994-187634 | 7/1994 |
| JP | 2001-068428 A | 3/2001 |
| JP | 2004-356572 A | 12/2004 |
| JP | 2006-188743 A | 7/2006 |
| KR | 10-1999-0023512 A | 3/1999 |
| KR | 2002-0002891 A | 1/2002 |
| KR | 10-0611755 | 8/2006 |
| KR | 2008-0079138 A | 8/2008 |

OTHER PUBLICATIONS

Office action dated Feb. 27, 2012 issued in corresponding Korean Patent Application No. 10-2010-0068007; 4pp.

* cited by examiner

*Primary Examiner* — Bilkis Jahan
(74) *Attorney, Agent, or Firm* — Christie, Parker & Hale, LLP

(57) ABSTRACT

An organic light emitting display device capable of preventing outgassing from a pixel defining layer (PDL) or a planarization layer and method of manufacturing the same.

21 Claims, 2 Drawing Sheets

ORGANIC LIGHT EMITTING DISPLAY DEVICE

CROSS-REFERENCE TO RELATED PATENT APPLICATION

This application claims priority to and the benefit of Korean Patent Application No. 10-2010-0068007, filed on Jul. 14, 2010, in the Korean Intellectual Property Office, the disclosure of which is incorporated herein in its entirety by reference.

BACKGROUND

1. Field

Aspects of embodiments according to the present invention relate to an organic light emitting display device and a method of manufacturing the same.

2. Description of the Related Art

In general, a flat panel display device may be categorized as a light-emitting type display device or as a light-receiving type display device. Light-emitting type display devices include flat cathode ray tubes, plasma display panels, electroluminescent display devices, light emitting diode display devices, or the like. Light-receiving type display devices include liquid crystal displays (LCDs) or the like. Among these display devices, electroluminescent display devices are expected to become next generation display devices due to their wide viewing angle, high contrast, and fast response speed. An electroluminescent display device may be an inorganic electroluminescent device or an organic electroluminescent device (e.g., organic light emitting display device), according to a material that forms an emitting layer (EML).

In this regard, the organic electroluminescent device is a self light-emitting type display device that emits light by electrically exciting a fluorescent organic compound. The organic electroluminescent device can be driven at a low voltage, can be made thin, and can solve problems related to a wide viewing angle and fast response speed of an LCD. Thus the organic electroluminescent device is expected to become a next generation display device.

The organic electroluminescent device includes an EML formed of an organic material between an anode electrode and a cathode electrode. In the organic electroluminescent device, when a positive voltage and a negative voltage are applied to the anode electrode and the cathode electrode, respectively, holes that are injected from the anode electrode move to the EML via a hole transport layer (HTL), and electrons from the cathode electrode move to the EML via an electron transport layer (ETL), so that the electrons and the holes are recombined in the EML to generate excitons.

When the excitons are changed from an excitation state to a ground state, fluorescent molecules in the EML emit light that may form an image. In the case of a full color type organic electroluminescent device, a full color spectrum is realized by having pixels that respectively emit red (R), green (G), and blue (B) colors.

In the organic electroluminescent device, a pixel defining layer (PDL) is formed at edges of the anode electrode, a predetermined aperture is formed in the PDL, and then the EML and the cathode electrode are sequentially formed above a portion of the anode electrode that is externally exposed due to the aperture.

SUMMARY

Embodiments according to the present invention provide an organic light emitting display device and a method of manufacturing the same, whereby it is possible to prevent outgassing of gas or moisture from an organic layer to an organic emitting layer (EML), and/or to prevent gas or moisture from the outside from entering the organic EML.

According to an aspect of the present invention, there is provided an organic light emitting display device including a substrate; a pixel circuit arranged above the substrate; a pixel electrode electrically connected to the pixel circuit; a pixel defining layer (PDL) exposing the pixel electrode; an intermediate layer arranged on the pixel electrode and configured to radiate light; and a first ion injected layer formed on the PDL.

The first ion injected layer may be formed by injecting ions into the PDL.

The ions may be $BHx+$ or $PH+$.

The first ion injected layer may be formed by heating the PDL at 200° C. and then injecting the ions into the PDL.

A thickness of the first ion injected layer may be 2000 Å to 3000 Å.

The PDL may be formed of an organic material, and the first ion injected layer may prevent gas from being discharged from the PDL.

The organic light emitting display device may further include a planarization layer that is arranged between the pixel electrode and the pixel circuit and covers the pixel circuit.

The planarization layer may include a contact hole for connection between the pixel electrode and the pixel circuit.

A second ion injected layer may be formed on the planarization layer.

The second ion injected layer may be formed by injecting ions into the planarization layer.

The ions may be $BHx+$ or $PH+$.

The second ion injected layer may be formed by heating the PDL at 200° C. and then injecting the ions into the planarization layer.

A thickness of the second ion injected layer may be 2000 Å to 3000 Å.

The second ion injected layer may prevent gas from being discharged from the planarization layer.

The pixel circuit may include a thin film transistor (TFT).

According to another aspect of the present invention, there is provided a method of manufacturing an organic light emitting display device, the method including the operations of forming a pixel circuit above a substrate; forming a passivation layer on the pixel circuit; forming a planarization layer on the passivation layer; forming a pixel electrode on the planarization layer; forming a PDL on the planarization layer so as to expose the pixel electrode; and forming a first ion injected layer on the PDL.

The operation of forming the first ion injected layer may include the operations of hardening the PDL; and injecting ions into the PDL.

The ions may be $BHx+$ or $PH+$.

The operation of injecting the ions may include the operation of forming the first ion injected layer by injecting the ions into a surface of the PDL.

A thickness of the first ion injected layer may be 2000 Å to 3000 Å.

The operation of hardening the PDL may include the operation of heating the PDL at 200° C.

After the operation of forming the planarization layer, the method may further include the operation of forming a second ion injected layer on the planarization layer.

The operation of forming the second ion injected layer may include the operations of hardening the planarization layer; and injecting ions into the planarization layer.

The ions may be BHx+ or PH+.

The operation of injecting the ions may include the operation of forming the second ion injected layer by injecting the ions into a surface of the planarization layer.

A thickness of the second ion injected layer may be 2000 Å to 3000 Å.

The operation of hardening the planarization layer may include the operation of heating the planarization layer at 200° C.

BRIEF DESCRIPTION OF THE DRAWINGS

The above and other features and aspects of the present invention will become more apparent by describing in detail exemplary embodiments thereof with reference to the attached drawings in which.

DETAILED DESCRIPTION

Hereinafter, the present invention will be described in detail by explaining exemplary embodiments of the invention with reference to the attached drawings.

Figure 1:
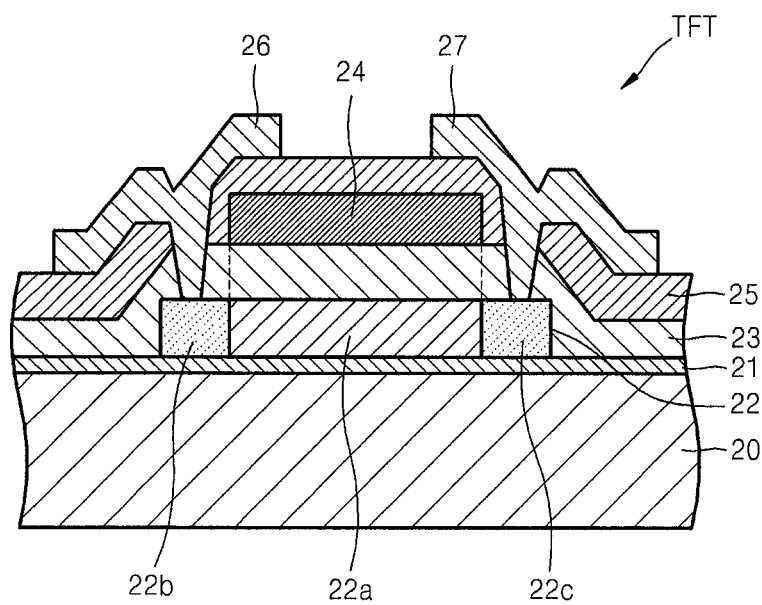
FIG. 1 is a cross-sectional view of a pixel circuit according to an embodiment of the present invention.

FIG. 1 is a cross-sectional view of a pixel circuit according to an embodiment of the present invention.

Referring to FIG. 1, the pixel circuit may be a thin film transistor (TFT). The TFT may be arranged on a substrate 20. The substrate 20 may include a glass substrate or a plastic substrate.

A buffer layer 21 is formed on the substrate 20, an active layer 22 formed of a semiconductor material is arranged on the buffer layer 21, and a gate insulating layer 23 is formed to cover the active layer 22. A gate electrode 24 is formed on the gate-insulating layer 23, an interlayer insulating layer 25 is formed to cover the gate electrode 24, and source/drain electrodes 26 and 27 are formed on the interlayer insulating layer 25. The source/drain electrodes 26 and 27 contact source/drain regions 22b and 22c of the active layer 22, respectively, via contact holes that are formed in the gate-insulating layer 23 and the interlayer insulating layer 25.

The active layer 22 above the substrate 20 may be formed of an inorganic semiconductor or an organic semiconductor, and includes the source/drain regions 22b and 22c doped respectively with n-type and p-type impurities, and a channel region 22a connecting the source/drain regions 22b and 22c.

Inorganic semiconductors that may form the active layer 22 may include one or more of CdS, GaS, ZnS, CdSe, CaSe, ZnSe, CdTe, SiC, and Si.

The organic semiconductor that may form the active layer 22 may include one or more of a polymer material including polythiophen or derivatives thereof, polyphenylenevinylene or derivatives thereof, polyfluorene or derivatives thereof, polythiophenevinylene or derivatives thereof, or polythiophen-heterocyclic aromatic copolymer or derivatives thereof, or may include a small-molecular material including pentacene, tetracene, oligoacene of naphthalene or derivatives thereof, alpha-6-thiophen, oligothiophen of alpha-5-thiophen or derivatives thereof, metallic or non-metallic phthalocyanine or derivatives thereof, pyromellitic dianhydride or pyromellitic diimide or derivatives thereof, or perylenetetracarboxylic dianhydride or perylenetetracarboxylic diimide or derivatives thereof.

The active layer 22 is covered by the gate-insulating layer 23, and the gate electrode 24 is formed on the gate-insulating layer 23. The gate electrode 24 may be formed as a conductive metallic layer including MoW, Al, Cr, Al/Cu, or the like. However, a material forming the gate electrode 24 is not limited thereto, and thus various types of conductive materials including a conductive polymer material may be used to form the gate electrode 24. The gate electrode 24 is formed to cover a region corresponding to the channel region 22a of the active layer 22.

Figure 2:
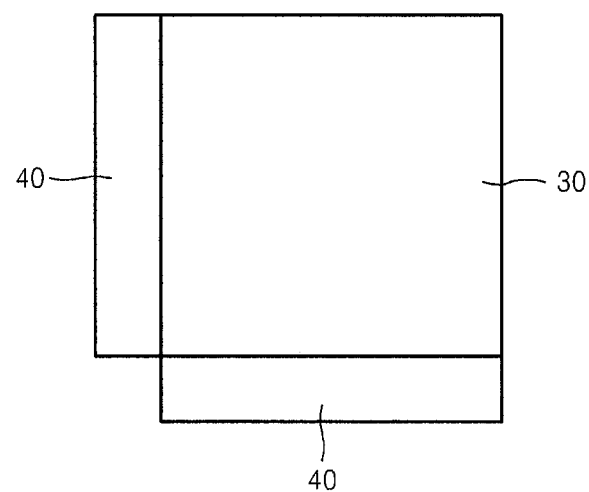
FIG. 2 is a schematic plan view of an organic light emitting display device according to another embodiment of the present invention.

FIG. 2 is a schematic plan view of an organic light emitting display device according to another embodiment of the present invention.

Referring to FIG. 2, the organic light emitting display device includes a display region 30, and circuit regions 40 at edges of the display region 30. The display region 30 includes a plurality of pixels, and each of the pixels includes a light-emission unit that emits light so as to realize an image.

According to the present embodiment, the light-emission unit is formed of a plurality of sub-pixels, each having an organic light emitting element device. In a full color organic light emitting display device, red (R), green (G), and blue (B) sub-pixels constitute a pixel by being arranged in various patterns including a line, a mosaic, a lattice, or the like. However, in some embodiments, the organic light emitting display device may not be a full color organic light emitting display device but may be a mono color organic light emitting display device.

The circuit regions 40 control an image signal that is input to the display region 30.

In the organic light emitting display device, at least one TFT may be arranged in the display region 30 and at least one TFT may be arranged in each of the circuit regions 40.

The at least one TFT that is arranged in the display region 30 includes a pixel-unit TFT including a switching TFT for controlling an operation of a light-emitting device by delivering a data signal to the light-emitting device according to a signal of a gate line, and a driving TFT for driving a current to flow in an organic light emitting element device according to a data signal. The at least one TFT that is arranged in each of the circuit regions 40 includes a circuit-unit TFT for embodying a circuit (e.g., a predetermined circuit).

The number of the TFTs and arrangement for the TFTs may vary according to characteristics of displays, and method of driving the displays.

Figure 3:
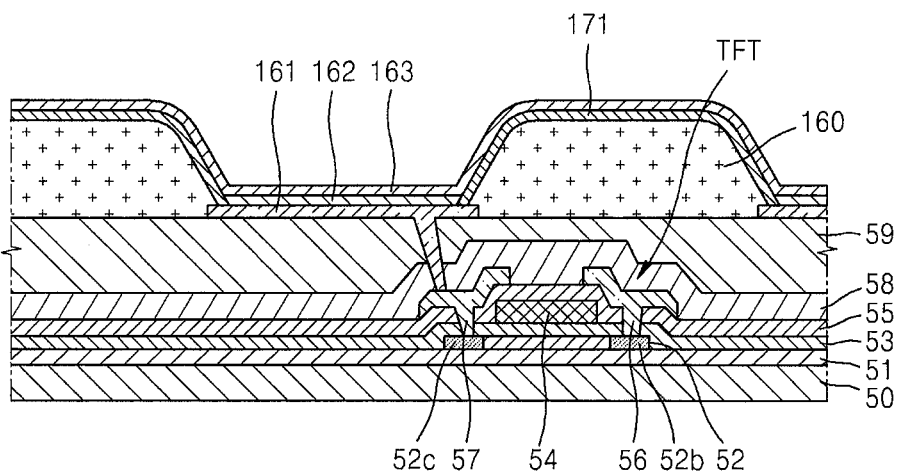
FIG. 3 is a cross-sectional view of an organic light emitting display device according to another embodiment of the present invention.

FIG. 3 is a cross-sectional view of an organic light emitting display device 100 according to another embodiment of the present invention.

Referring to FIG. 3, a buffer layer 51 is arranged on a substrate 50 that is formed of a glass material or a plastic material, and a TFT, as a device circuit unit (or pixel circuit), and an organic light emitting element device may be formed thereon.

An active layer 52 having a pattern (e.g., a predetermined pattern) is arranged on the buffer layer 51 on the substrate 50. A gate insulating layer 53 is arranged on the active layer 52, and a gate electrode 54 is formed (e.g., in a predetermined region) on the gate insulating layer 53. The gate electrode 54 is connected to a gate line (not shown) for applying TFT on/off signals. An interlayer insulating layer 55 is formed on the gate electrode 54, and source/drain electrodes 56 and 57 are formed to contact source/drain regions 52b and 52c of the active layer 52, respectively, via contact holes. A passivation layer 58 that is formed of $SiO_2$ or SiNx is arranged on the source/drain electrodes 56 and 57, and a planarization layer 59 that is formed of an organic material including acryl, polyimide, benzocyclobutene (BCB), or the like may be formed on the passivation layer 58.

A pixel electrode 161 that functions as an anode electrode of the organic light emitting element device is formed on the planarization layer 59, and a pixel defining layer (PDL) 160 is formed to cover the pixel electrode 161. The PDL 160 may be formed of an organic material.

After an aperture (e.g., a predetermined aperture) is formed in the PDL 160, an intermediate layer 162 is formed on the PDL 160 and on a top surface of the pixel electrode 161 externally exposed by the formed aperture. Here, the intermediate layer 162 includes an EML. However, a structure of the organic light emitting display device 100 according to the present embodiment is not limited thereto, and thus the organic light emitting display device 100 may have a structure of any of various organic light emitting display devices.

A first ion injected layer 171 (e.g., a first protection layer) is formed on the PDL 160. The first ion injected layer 171 is formed by injecting ions into a surface of the PDL 160, which may be formed of an organic material. The ions injected into the surface of the PDL 160 may be BHx+ or PH+. The ions are injected from the surface of the PDL 160 to a depth of about 2000 Å to 3000 Å to form the first ion injected layer 171. Thus, a thickness of the first ion injected layer 171 may be about 2000 Å to 3000 Å.

The first ion injected layer 171 is formed by heating the PDL 160, which may be formed of the organic material, at about 200° C., hardening the PDL 160, and then injecting BHx+ or PH+ into the surface of the PDL 160 by using an ion injecting apparatus. The first ion injected layer 171 may have a Diamond Like Carbon (DLC) structure on the PDL 160. For example, the BHx+or PH+ions may be injected using the ion injecting apparatus by applying an ion acceleration voltage of 80 to 100 kV using gases such as, for example, $B_2H_6$ or $PH_3$.

The first ion injected layer 171 may prevent outgassing from the PDL 160. That is, since the PDL 160 is formed of an organic material, gas or moisture existing in the PDL 160 may be discharged from the PDL 160 while or after the organic light emitting display device 100 is manufactured. The gas or moisture discharged from the PDL 160 may react with the intermediate layer 162 including the EML, and reduce a lifetime of the organic light emitting display device 100. However, in the present embodiment, the first ion injected layer 171 is formed on the PDL 160, so that it is possible to prevent gas or moisture in the PDL 160 from being discharged to the outside. Accordingly, the first ion injected layer 171 may prevent reduction of the lifetime of the organic light emitting display device 100 due to outgassing from the PDL 160.

The organic light emitting element device emits red, green, and blue light according to a flow of a current, and thus displays image information. The organic light emitting element device (e.g., organic light emitting diode) is formed of the pixel electrode 161, an opposite electrode 163, and the intermediate layer 162, wherein the pixel electrode 161 is electrically connected to the drain electrode 57 of the TFT and receives a positive voltage, the opposite electrode 163 is formed to cover an entire pixel and supplies a negative voltage to the intermediate layer 162, and the intermediate layer 162 is located between the pixel electrode 161 and the opposite electrode 163 and may emit light.

The pixel electrode 161 and the opposite electrode 163 are insulated from each other by the intermediate layer 162, and cause light-emission to be performed in the intermediate layer 162 by supplying a positive voltage and a negative voltage to the intermediate layer 162.

Here, the intermediate layer 162 may be formed as a small-molecular organic layer or a polymer organic layer. In a case where the intermediate layer 162 is formed as the small-molecular organic layer, the intermediate layer 162 may have a single or multi-layered structure in which a hole injection layer (HIL), a hole transport layer (HTL), an EML, an electron transport layer (ETL), and an electron injection layer (EIL) are stacked. An organic material that may be possibly used as the small-molecular organic layer includes copper phthalocyanine (CuPc), N,N'-Di(naphthalene-1-yl)-N,N'-diphenyl-benzidine (NPB), tris-8-hydroxyquinoline aluminum)($Alq_3$), and the like. The small-molecular organic layer may be formed by performing vacuum deposition.

In a case where the intermediate layer 162 is formed as the polymer organic layer, the intermediate layer 162 may have a structure in which an HTL and an EML are arranged. Here, the HTL may be formed of poly-(2,4)-ethylene-dihydroxy thiophene (PEDOT), and the EML may be formed of a polymer organic material including a Poly-Phenylenevinylene (PPV) based material, a polyfluorene-based material, or the like. The HTL and the EML may be formed by performing a screen coating method or an inkjet printing method.

However, a type of the intermediate layer 162 is not limited thereto, and thus any of various types may be applied to the intermediate layer 162.

The intermediate layer 162 may be formed by performing a spin coating method. In more detail, an organic material is coated to cover the pixel electrode 161 and the PDL 160. Afterward, the substrate 50 is spun. According to the amount of spin of the substrate 50, the organic material coated on the PDL 160 is removed, and only the organic material coated on the pixel electrode 161 remains. Next, the organic material coated on the pixel electrode 161 is fired to form the intermediate layer 162.

The pixel electrode 161 functions as an anode electrode, and the opposite electrode 163 functions as a cathode electrode, or vice versa.

The pixel electrode 161 may be formed as a transparent electrode or a reflective electrode. When the pixel electrode 161 is a transparent electrode, the pixel electrode 161 may be formed of a material including ITO, IZO, ZnO, or $In_2O_3$, and when the pixel electrode 161 is a reflective electrode, the pixel electrode 161 may be formed in a manner in which a reflective layer is formed of a material selected from the group consisting of Ag, Mg, Al, Pt, Pd, Au, Ni, Nd, Ir, Cr, and compounds thereof, and then a material including ITO, IZO, ZnO, or $In_2O_3$ and having a high work function is formed thereon.

Meanwhile, the opposite electrode 163 may be formed as a transparent electrode or a reflective electrode. When the opposite electrode 163 is a transparent electrode, the opposite electrode 163 functions as the cathode electrode, and thus the opposite electrode 163 is formed in a manner in which metal having a low work function and selected from the group consisting of Li, Ca, LiF/Ca, LiF/Al, Al, Ag, Mg, and compounds thereof, may be deposited so as to face the opposite electrode 163, and then an auxiliary electrode layer or a bus electrode line may be formed thereon by using a transparent electrode forming material including ITO, IZO, ZnO, or $In_2O_3$. When the opposite electrode 163 is a reflective electrode, the opposite electrode 163 is formed of a material selected from the group consisting of Li, Ca, LiF/Ca, LiF/Al, Al, Ag, Mg, and compounds thereof by deposition.

Figure 4:
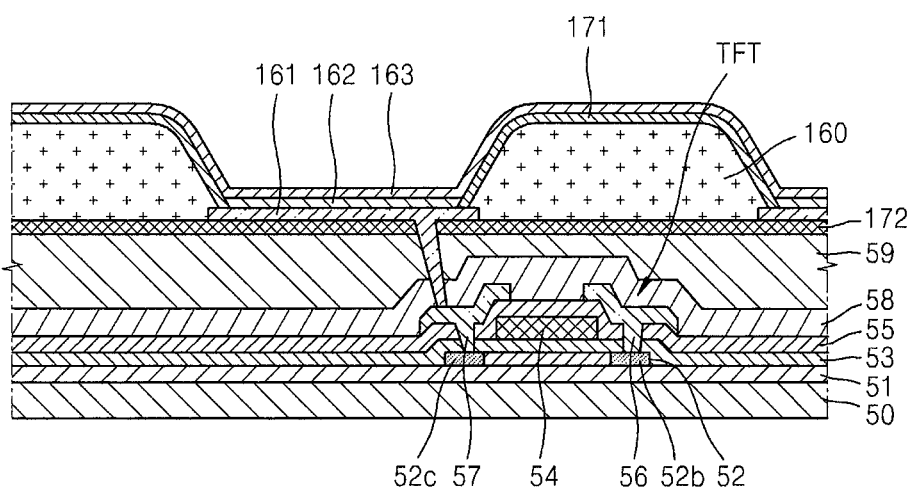
FIG. 4 is a cross-sectional view of an organic light emitting display device according to another embodiment of the present invention.

FIG. 4 is a cross-sectional view of an organic light emitting display device 200 according to another embodiment of the present invention.

The organic light emitting display device 200 of FIG. 4 is different from the organic light emitting display device 100 of FIG. 3 in that a second ion injected layer 172 is formed on the planarization layer 59.

In more detail, the second ion injected layer 172 (e.g., a second protection layer) may be formed on the planarization layer 59. The second ion injected layer 172 is formed by injecting ions into a surface of the planarization layer 59 that may be an organic material. The ions injected into the surface of the planarization layer 59 may be BHx+ or PH+. The ions are injected from the surface of the planarization layer 59 to a depth of about 2000 Å to 3000 Å to form the second ion injected layer 172. Thus, a thickness of the second ion injected layer 172 may be about 2000 Å to 3000 Å.

The second ion injected layer 172 is formed by heating the planarization layer 59, which may be the organic material, at about 200° C., hardening the planarization layer 59, and then injecting BHx+ or PH+ into the surface of the planarization layer 59 by using an ion injecting apparatus. The second ion injected layer 172 may have a DLC structure on the planarization layer 59.

The second ion injected layer 172 may prevent outgassing from the planarization layer 59. That is, since the planarization layer 59 is formed of an organic material, gas or moisture existing in the planarization layer 59 may be discharged from the planarization layer 59 while or after the organic light emitting display device 200 is manufactured. The gas or moisture discharged from the planarization layer 59 may react with the intermediate layer 162 including the EML, and reduce a lifetime of the organic light emitting display device 200. However, in the present embodiment, the second ion injected layer 172 is formed on the planarization layer 59, so that it is possible to prevent gas or moisture in the planarization layer 59 from being discharged to the outside. Accordingly, the second ion injected layer 172 may prevent reduction of the lifetime of the organic light emitting display device 200 due to outgassing from the planarization layer 59.

According to the one or more embodiments of the present invention, it is possible to prevent external gas from penetrating to an organic emitting layer, or to prevent outgassing from an organic layer including a PDL.

While the present invention has been particularly shown and described with reference to exemplary embodiments thereof, it will be understood by those of ordinary skill in the art that various changes in form and details may be made therein without departing from the spirit and scope of the present invention as defined by the following claims and their equivalents.

What is claimed is:

1. An organic light emitting display device comprising:
a substrate;
a pixel circuit on the substrate;
a pixel electrode electrically coupled to the pixel circuit;
a pixel defining layer (PDL) exposing the pixel electrode;
an intermediate layer on the pixel electrode, the intermediate layer being configured to radiate light;
a first ion injected layer comprising organic material and located on the PDL; and
a second ion injected layer comprising organic material and located between the pixel electrode and the substrate,
wherein the first ion injected layer and the second ion injected layer comprise ions BHx+or PH+,
wherein the second ion injected layer directly contacts the PDL and overlaps with the first ion injected layer, and
wherein a side surface of the pixel electrode is not covered by the second ion injected layer.

2. The organic light emitting display device of claim 1, wherein the PDL comprises an organic material, and the first ion injected layer prevents gas from being discharged from the PDL.

3. The organic light emitting display device of claim 1, wherein a thickness of the second ion injected layer is in a range of 2000 Å to 3000 Å.

4. The organic light emitting display device of claim 1, wherein the pixel circuit comprises a thin film transistor (TFT).

5. The organic light emitting display device of claim 1, wherein the first ion injected layer is formed by injecting the ions into the PDL.

6. The organic light emitting display device of claim 5, wherein the first ion injected layer is formed by hardening the PDL at 200° C. and then the injecting of the ions into the PDL.

7. The organic light emitting display device of claim 5, wherein a thickness of the first ion injected layer is in a range of 2000 Å to 3000 Å.

8. The organic light emitting display device of claim 1, further comprising a planarization layer between the pixel electrode and the pixel circuit and covering the pixel circuit.

9. The organic light emitting display device of claim 8, wherein the planarization layer has a contact hole for connection between the pixel electrode and the pixel circuit.

10. The organic light emitting display device of claim 8, wherein the second ion injected layer prevents gas from being discharged from the planarization layer.

11. The organic light emitting display device of claim 8, wherein the second ion injected layer is formed by injecting the ions into the planarization layer.

12. The organic light emitting display device of claim 11, wherein the second ion injected layer is formed by hardening the PDL at 200° C. and then the injecting of the ions into the planarization layer.

13. A method of manufacturing an organic light emitting display device, the method comprising:
forming a pixel circuit on a substrate;
forming a passivation layer on the pixel circuit;
forming a planarization layer on the passivation layer;
forming a pixel electrode on the planarization layer and electrically coupled to the pixel circuit;
forming an intermediate layer on the pixel electrode, the intermediate layer being configured to radiate light;
forming a pixel defining layer (PDL) on the planarization layer so as to expose the pixel electrode;
forming a first ion injected layer comprising organic material and located on the PDL; and
forming a second ion injected layer comprising organic material and located between the pixel electrode and the substrate,
wherein the first ion injected layer and the second ion injected layer comprise ions BHx+or PH+,
wherein the second ion injected layer directly contacts the PDL and overlaps with the first ion injected layer, and
wherein a side surface of the pixel electrode is not covered by the second ion injected layer.

14. The method of claim 13, wherein a thickness of the second ion injected layer is in a range of 2000 Å to 3000 Å.

15. The method of claim 13, wherein the forming of the second ion injected layer comprises:
hardening the planarization layer; and
injecting the ions into the planarization layer.

16. The method of claim 15, wherein the injecting of the ions comprises forming the second ion injected layer by the injecting of the ions into a surface of the planarization layer.

17. The method of claim 15, wherein the hardening of the planarization layer comprises heating the planarization layer at 200° C.

18. The method of claim 13, wherein the forming of the first ion injected layer comprises:
   hardening the PDL; and
   injecting the ions into the PDL.

19. The method of claim 18, wherein the hardening of the PDL comprises heating the PDL at 200° C.

20. The method of claim 18, wherein the injecting of the ions comprises forming the first ion injected layer by the injecting of the ions into a surface of the PDL.

21. The method of claim 20, wherein a thickness of the first ion injected layer is in a range of 2000 Å to 3000 Å.

\* \* \* \* \*

UNITED STATES PATENT AND TRADEMARK OFFICE
CERTIFICATE OF CORRECTION

Page 1 of 1

PATENT NO.        : 8,569,761 B2
APPLICATION NO.   : 13/162455
DATED             : October 29, 2013
INVENTOR(S)       : Soo-Beom Jo et al.

It is certified that error appears in the above-identified patent and that said Letters Patent is hereby corrected as shown below:

In the Claims

Column 7, line 67, Claim 1          Delete "BHx+or"

Insert -- BHx+ or --

Column 8, line 57, Claim 13         Delete "BHx+or"

Insert -- BHx+ or --

Signed and Sealed this
Ninth Day of June, 2015

Michelle K. Lee
*Director of the United States Patent and Trademark Office*